(12) United States Patent
Hiroshima (10) Patent No.: US 8,090,188 B2
(45) Date of Patent: Jan. 3, 2012

(54) APPARATUS INCLUDING DEFECT CORRECTING SYSTEM WHICH REPEATS A CORRECTING OF A RETICLE PATTERN DEFECT AND A CORRECTING METHOD USING THE APPARATUS

(75) Inventor: Masahito Hiroshima, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 1020 days.

(21) Appl. No.: 11/878,574

(22) Filed: Jul. 25, 2007

(65) Prior Publication Data
US 2008/0050010 A1    Feb. 28, 2008

(30) Foreign Application Priority Data
Jul. 26, 2006    (JP) ................................. 2006-203464

(51) Int. Cl.
G06K 9/00 (2006.01)
G01N 21/00 (2006.01)
H04N 9/47 (2006.01)
H04N 7/18 (2006.01)
G06F 17/50 (2006.01)

(52) U.S. Cl. ........ 382/144; 382/141; 382/145; 382/149; 348/87; 348/125; 348/126; 356/237.1; 356/237.5

(58) Field of Classification Search ........................ None
See application file for complete search history.

(56) References Cited

U.S. PATENT DOCUMENTS

| | | | |
|---|---|---|---|
| 5,799,104 A * | 8/1998 | Nakamura et al. | 382/144 |
| 6,016,357 A * | 1/2000 | Neary et al. | 382/144 |
| 6,991,878 B2 * | 1/2006 | Kanamitsu et al. | 430/5 |
| 7,107,571 B2 | 9/2006 | Chang et al. | |
| 7,285,792 B2 * | 10/2007 | Watanabe et al. | 250/492.2 |
| 7,523,027 B2 * | 4/2009 | Chang et al. | 703/13 |
| 2005/0226492 A1 * | 10/2005 | Ho | 382/144 |

FOREIGN PATENT DOCUMENTS

| | | |
|---|---|---|
| JP | 2000-330261 | 11/2000 |
| JP | 2000-347384 | 12/2000 |
| JP | 2001-516898 | 10/2001 |
| JP | 2004-37579 | 6/2002 |
| JP | 2003-140321 | 5/2003 |
| JP | 2004-12779 | 1/2004 |
| JP | 2004-37579 | 2/2004 |
| JP | 2005-189491 | 7/2005 |
| JP | 2005-309140 | 11/2005 |
| JP | 2006-139049 | 6/2006 |

OTHER PUBLICATIONS

Japanese Office Action dated Jul. 2, 2008 with Partial English-Language Translation.

* cited by examiner

*Primary Examiner* — Tom Y Lu
*Assistant Examiner* — Thomas Conway
(74) *Attorney, Agent, or Firm* — McGinn IP Law Group, PLLC (57) ABSTRACT

A reticle pattern defect correcting apparatus comprises a lithographic emulation system including an optical emulation system and a micromachining defect correcting system including a reticle defect correcting mechanism with a cantilever. Since correction of a reticle pattern defect is carried out while the transferred image is being observed in real time by the optical emulation system, it is possible to achieve an efficient reticle pattern correction while avoiding overcorrection and other problems.

19 Claims, 12 Drawing Sheets

APPARATUS INCLUDING DEFECT CORRECTING SYSTEM WHICH REPEATS A CORRECTING OF A RETICLE PATTERN DEFECT AND A CORRECTING METHOD USING THE APPARATUS

This application is based upon and claims the benefit of priority from Japanese patent application No. 2006-203464, filed on Jul. 26, 2006, the disclosure of which is incorporated herein in its entirety by reference.

BACKGROUND OF THE INVENTION

1. Field of the Invention

The present invention relates to a defect correcting apparatus and a correct method for a photo mask (to be denoted as a reticle hereinbelow) that is used in a lithographic process with a reduction-projection exposure apparatus for use in manufacturing semiconductor devices.

2. Description of the Related Art

Recently, in the lithographic process used for manufacturing semiconductor devices, reduction-projection exposure equipment is generally used in order to deal with the formation of micro patterns. In a reduction projection exposure apparatus, a reticle having a pattern that is, for example, four times as large as the photoresist (to be denoted as "resist" hereinbelow) pattern to be formed on a semiconductor substrate surface is used as an exposure mask. Usually, one reticle is used for manufacturing more than tens of millions of semiconductor devices. The quality of the patterns formed on the reticle, therefore exerts a great influence on the production yield of the semiconductor devices. The quality of the pattern is essentially determined depending on the presence or absence of pattern defects. This is why the defect inspection on reticle patterns is a requisite stage to improve the production yield of semiconductor devices.

Further, various pattern correcting technologies such as phase shift techniques, optical proximity correction and the like for forming extra fine patterns are demanded for the production of reticles that are used for recent highly integrated semiconductor devices, and realization of such technologies needs an enormous amount of information processing. As a result, the production cost for a reticle has become very expensive. In order to prevent an increase in cost, a good deal of effort is directed towards using all possible correcting means to ensure that reticles that pattern defects can be made usable.

Figure 1:
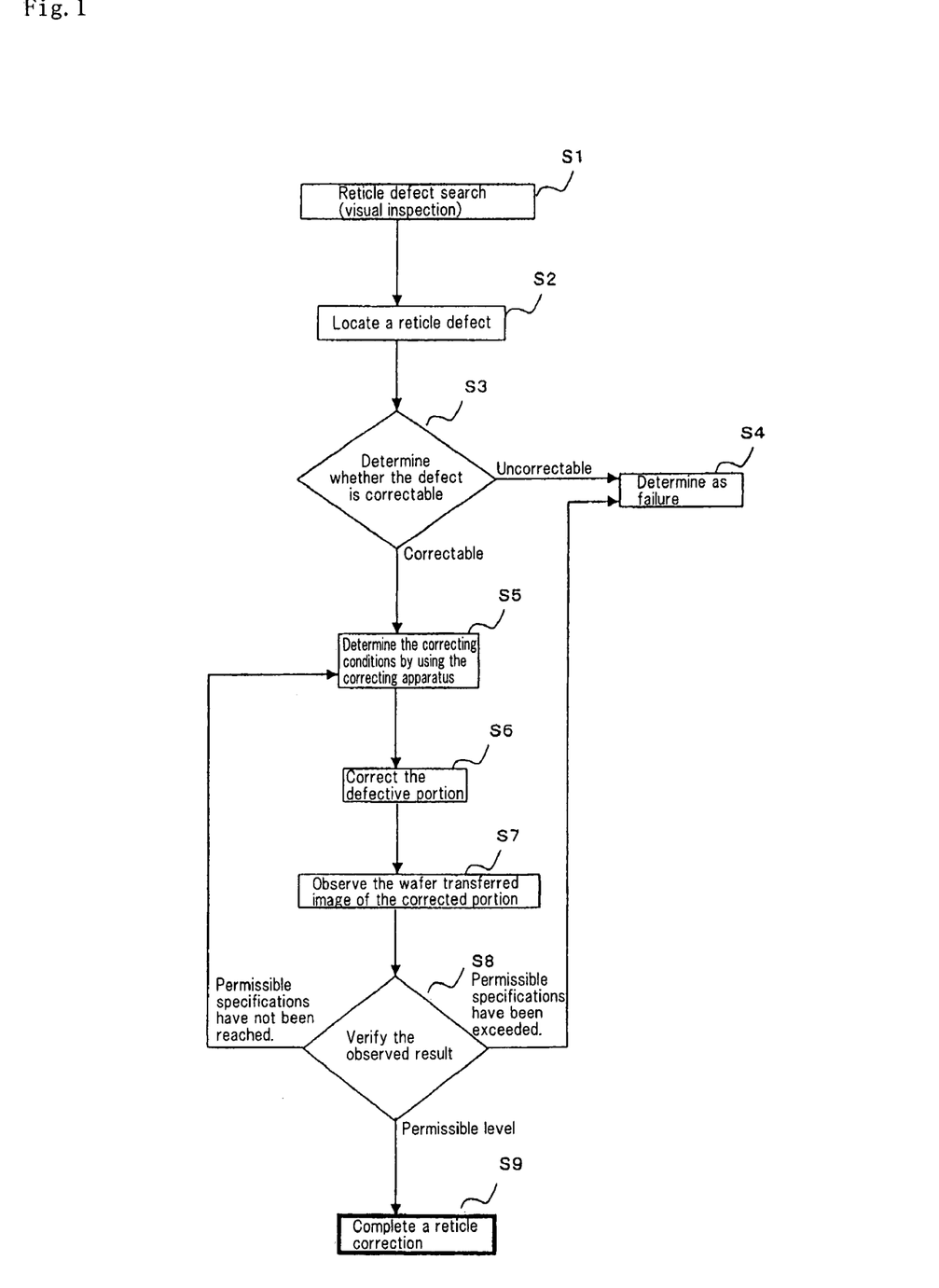
FIG. 1 is a flow chart showing a conventional reticle pattern defect correcting method.

FIG. 1 shows a flow chart for explaining conventional steps for correcting defects of a reticle. A reticle that is finished with pattern formation is set on a visual inspection device so as to check whether there is any defect (Step S1). When a pattern defect is found, the pattern defect is located (Step S2). Then, it is determined whether the pattern defect can be corrected (Step S3). If there exists a large defect that affects a large number of patterns, the defect is determined to be uncorrectable (Step S4), and the reticle is determined to be a failure and discarded. On the other hand, when the defect is determined to be correctable, then the reticle is set on a pattern defect correcting apparatus, and the correcting conditions are determined (Step S5). Subsequently, correction of the pattern defect is carried out based on the correcting conditions (Step S6). Then, the corrected reticle is set on an optical microscopic type wafer exposure optical emulation system that includes an illumination optical lens system equivalent to that of the wafer exposure device and a projection optical lens system capable of providing a resolution equivalent to that of the wafer exposure device, and the image of the corrected defective pattern portion is observed (Step S7). The optical information obtained from the image-forming surface in the aforementioned emulation system is displayed as an optical image of the defect on the reticle with a resist pattern (transferred image), which is transferred onto the wafer by the actual wafer exposure device.

Next, from the wafer transferred image of the defective pattern portion, obtained at Step S7, the maximum light intensity, minimum light intensity, contrast and steepness of the optical steep characteristic of the above optical image are obtained, and the variational values of the image size of the defective portion calculated based on these pieces of data and the threshold of light intensity that is uniquely determined from the target resist size are determined. Then these size variational values are compared to the permissible specifications of the product so as to determine whether correction is permissible (Step S8). When it was determined that the correction level has not reached the permissible specifications due to an insufficient amount of correction, the operation returns to Step S5 again, and additional correcting conditions are set up based on the operator's empirical rule, taking into consideration the result at Step 7 in comparison with the correcting conditions set at previous Step S5.

Thereafter, Steps S6 and S7 are executed, and the result of correction is evaluated once again. This correction routine of steps is repeated until the result falls within the desired level of correction. Only when the result meets the permissible specifications of the product at Step S8 after the latest Step S7, the reticle is determined to be acceptable, and the correction of the reticle pattern defect is completed (Step S9). On the other hand, when overcorrection was made so that the result exceeds the permissible limit level of the production permissible specifications, and it is determined at Step S8 that there is no way to make a restoration from the excessive correction to the initial condition, this situation is regarded as an event in which continuation of the reticle fabrication is impossible, and the operation goes to Step S4, where the result is determined to be a failure.

The reticle pattern defect inspection and defect correcting method as above are disclosed in Japanese Patent Application Disclosure No. 516898/2001 and Japanese Patent Application Laid-open No. 037579/2004.

Reticle pattern defects, as the target of the above correction, are roughly classified into two categories. One is a pattern defect that is generally called a black defect, such as a projective defect that juts out from an inherent device pattern edge, an isolated defect remaining at an area where there should be no pattern, and the like. The other one is a pattern defect that is generally called a white defect, such as a crack defect in a pattern edge area (mouse-bite), a micro opening defect of a pinhole and the like.

Correction of the former one, i.e., a black defect, is carried out by a sputter etching process in a vacuum using a FIB (Focus Ion Beam) apparatus or by a micro machining technique by which the defective portion is physically crushed under normal pressure by an extra fine needle (cantilever) and the broken pieces are removed. On the other hand, correction of the latter one, i.e., a white defect, is generally carried out by an ion beam deposition method whereby a shading film is deposited on the defective portion by a FIB apparatus.

When a high degree of difficulty is expected to correct a pattern defect on a reticle, the amount of correction at one time is set to be small so as to improve the accuracy of correction at Step S6 in FIG. 1. That is, taking into account the result of correction at Step S7 that correspond to the correcting conditions set up at the previous Step S5, step-by-step correction and the inspection routine of the corrected result is repeated.

Figure 2:
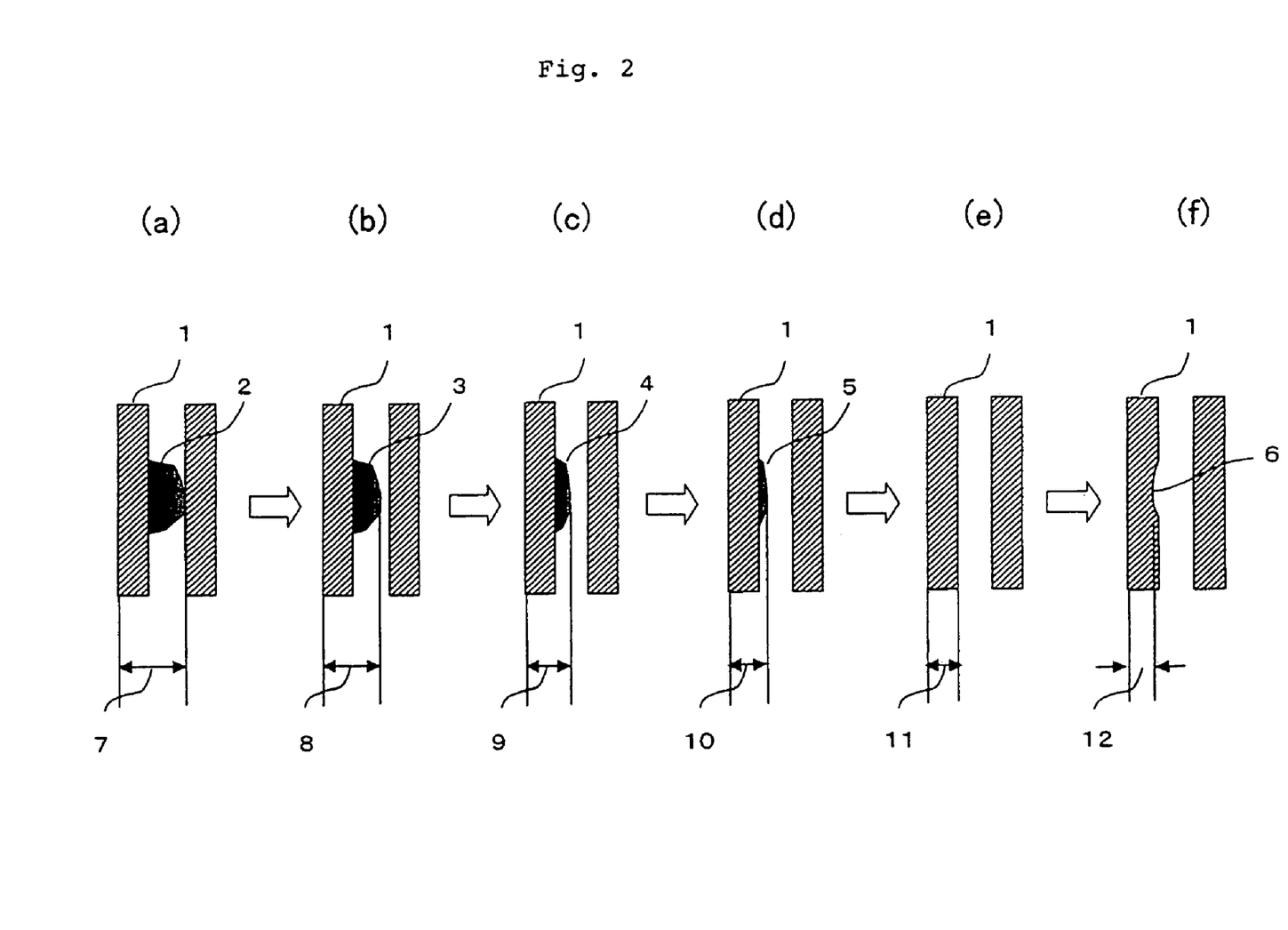
FIG. 2 is a schematic diagram showing the steps of correcting a black projection defect in a conventional shading chromium mask.
Figure 3:
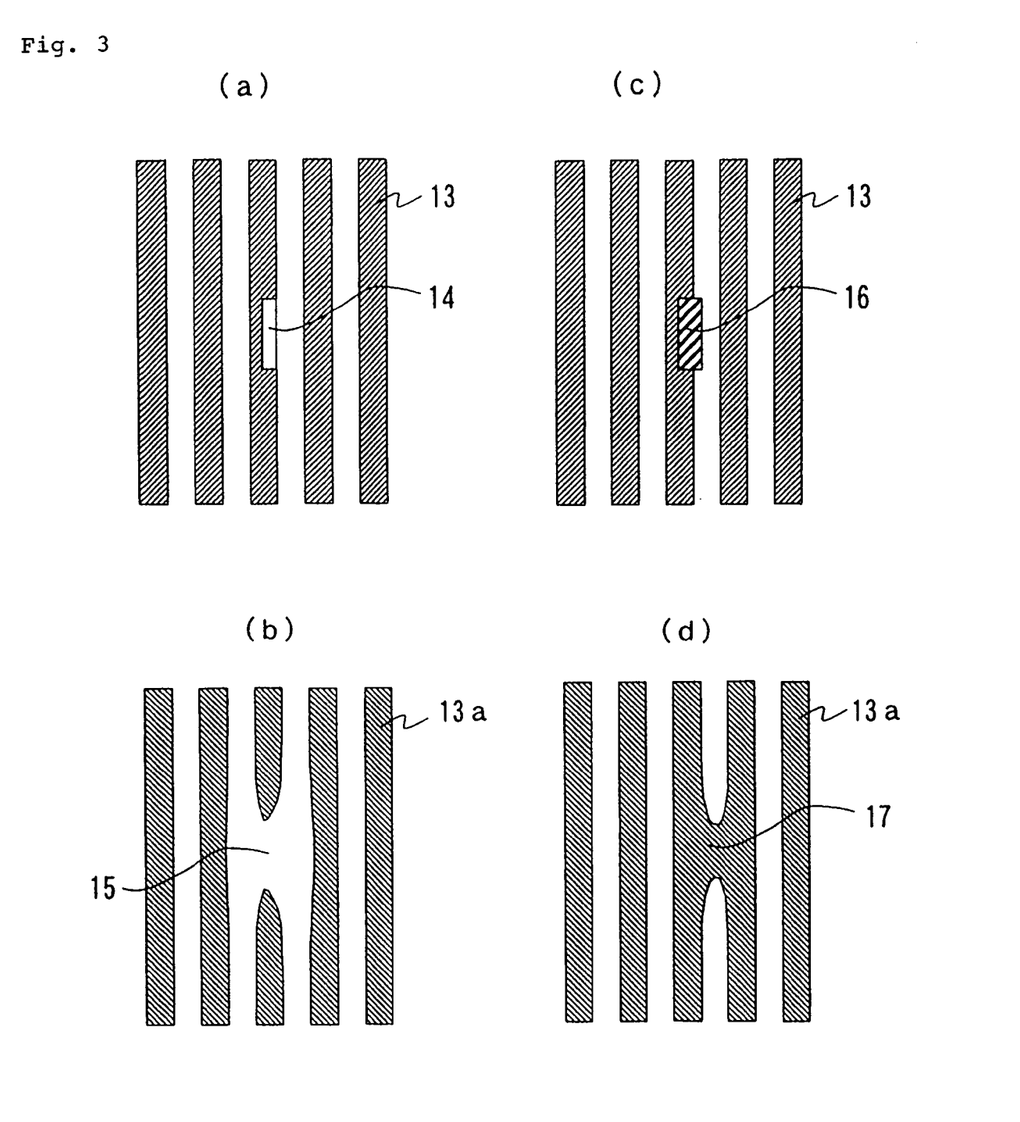
FIG. 3 a diagram for explaining the problem of a defect in a conventional halftone phase shift mask.

Referring now to FIGS. 2(a) to 2(f), the above step-by-step correction case will be described taking an example in which there exists a projection defect between two line patterns on a reticle. FIG. 2(a) shows a state in which projection defect 2 exists between two line patterns 1. Here, line pattern 1 is formed of a shading chromium layer having a light transmittance of 0% while the white part in the drawing is assumed to be of glass. To begin with, the reticle is set on an inspection apparatus such as an optical viewer having a high resolution, SEM (Scanning Electron Microscopy) or the like, so as to measure the position of projection defect 2 and defect size 7. Then, an optimal defect correcting apparatus is selected taking into account the condition of the defect. When a black defect exists close to dense device patterns and when a high accuracy correction is demanded, as in this example, a micromachining technique using a cantilever is employed. After the reticle is set on a micromachining apparatus, the first correcting conditions are set and correction of projection defect 2 is effected. Then, the reticle is set on the inspection apparatus once again, and defect size 8 of the first correction result shown in FIG. 2(b) is estimated so as to determine whether another correction is needed. In this example, since defect size 8 is not equal to size 11 (FIG. 2(e)) of the normal part, it is determined that the last correction is insufficient, and an additional correction is carried out. The reticle is set on the micromachining apparatus once again, and a correction is made based on the correcting conditions that have been newly set up. Since, in FIGS. 2(c) and 2(d), corrected defect sizes 9 and 10 are not equal to size 11 of the normal part, it is determined that a further additional correction is needed. This correcting routine is repeated until the final corrected result converges to defect size 11 in FIG. 2(e).

Here, as shown in FIG. 2(f), if corrected part 6 has defect size 12, the projection defect is excessively corrected. Accordingly, it is determined that the current correcting routine cannot be continued any longer.

As above, in the related defect correcting method, estimation of the defect size, setup of the correcting conditions, observation of the corrected result, determination of whether the corrected result is acceptable or not, are performed separately. As a result, in the series of correcting steps, from Steps S5 to S8 shown in FIG. 1, it is impossible to achieve efficient correction since there is no other way to rely on the recurrent convergence method based on an empirical rule. Since the process depends on an empirical rule, the estimate of conditions for additional correction in the next loop is mere expectation based on the previous correction result. For this reason, the final correction results in overcorrection due to expectation errors, causing the problem of convergence impossible. Further, since it is hence difficult to grasp the processing capacity because the required time for completing the correction and the number of total steps are not constant, this method faces difficulties in taking measures to reduce the time for correction.

Next, as another problem with a related defect correcting method, an example of correcting a defect in a reticle pattern made up of a halftone phase shift mask will be described with reference to FIGS. 3 to 7.

FIG. 3(a) shows a reticle pattern made of a halftone phase shift mask. Pattern 13 forming a shading portion has an incident light transmittance of 6 to 8%, and is made of a translucent film that reverses the phase of its diffracted light or shifts the phase by 180 degrees relative to the glass portion having an incident light transmittance of 100%, around the pattern. There exists white defect 14 in a part of pattern 13. FIG. 3(b) shows transferred pattern 13a when the reticle pattern of FIG. 3(a) is transferred to the wafer. Since the light intensity at the part of white defect 14 is high, wire break 1 arises around the area corresponding to white defect 14 in the transferred image.

In contrast, FIG. 3(c) shows a case where black defect 16 exists in a part of pattern 13 on the reticle. FIG. 3(d) shows transferred image 13a of FIG. 3(c). Bridging 17 arises between the patterns around the area corresponding to black defect 16 in the transferred image.

As described above, when white defect 14 shown in FIG. 3(a) and black defect 16 shown in FIG. 3(c) are corrected, the black defect can be corrected by removing the projected part. On the other hand, to correct white defect, chromium film is film locally formed around the cutout first, then the unnecessary projected part of the chromium film is removed. Since chromium film has a light transmittance of 0%, a defect corrected part consisting of chromium film having a light transmittance of 0% will remain in the translucent film having a light transmittance of 6 to 8% after correction of the white defect. This coexistence of films having different light transmittances makes it difficult to correct a halftone phase shift mask, especially a white defect. Next, the reason correction of a white defect in a halftone phase shift mask is made difficult will be described.

Figure 4:
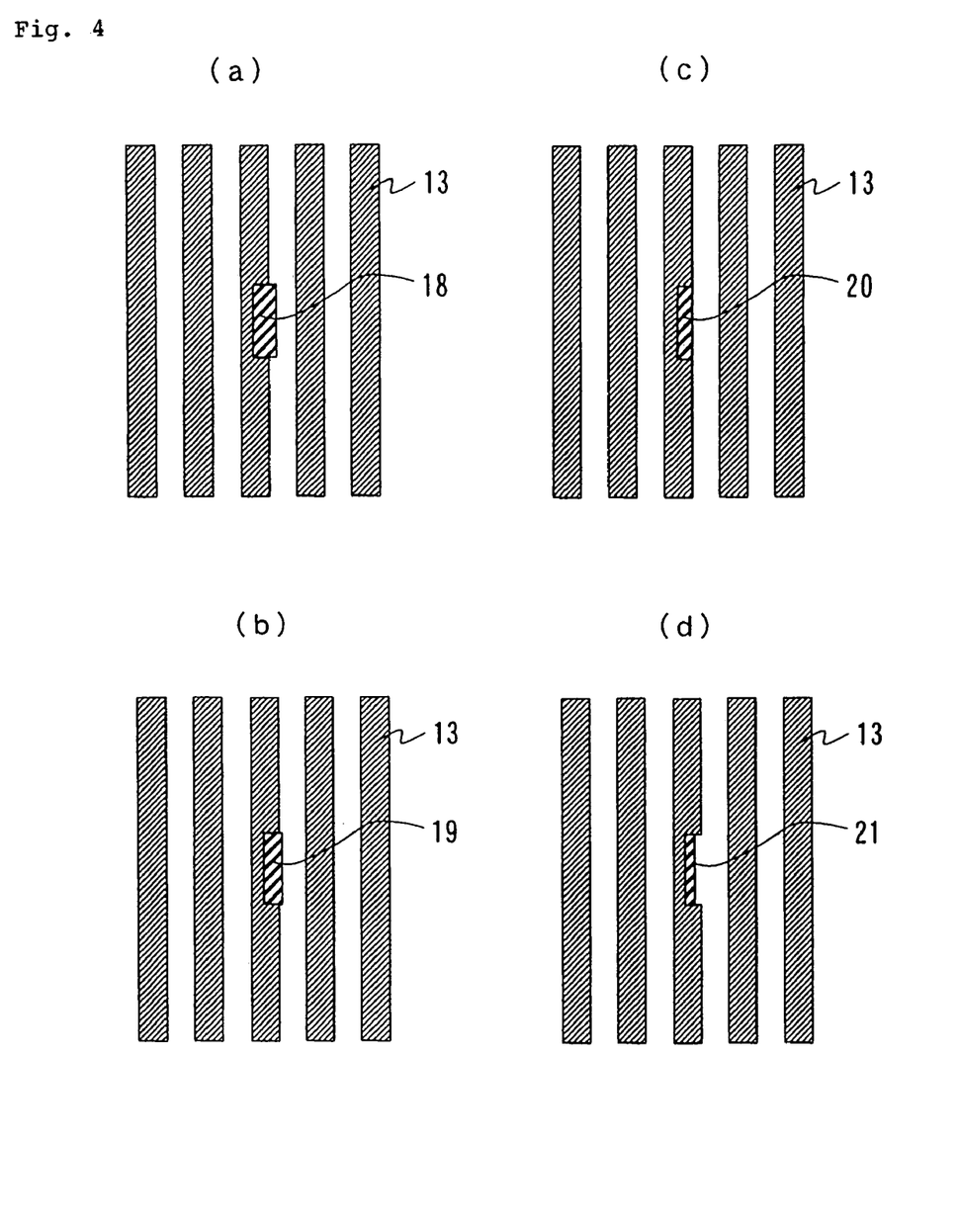
FIG. 4 is a schematic diagram showing a method of correcting a white defect in a conventional halftone phase shift mask.

FIG. 4 shows a process in which chromium film is film locally formed over white defect 14 shown in FIG. 3(a) and then corrections are made step by step. FIG. 4(a) shows a state in corrected portion 18 directly after chromium film is film locally formed. FIG. 4(b) shows corrected portion 19 that has been corrected up to a condition in which a marginal projection remains along the pattern edge of the normal portion. FIG. 4(c) shows corrected portion 20 that has been corrected up to the position of the pattern edge of the normal portion. FIG. 4(d) shows corrected portion 21 that has been excessively corrected to a condition in which an indentation into the patter is formed from the pattern edge of the normal portion.

Figure 5:
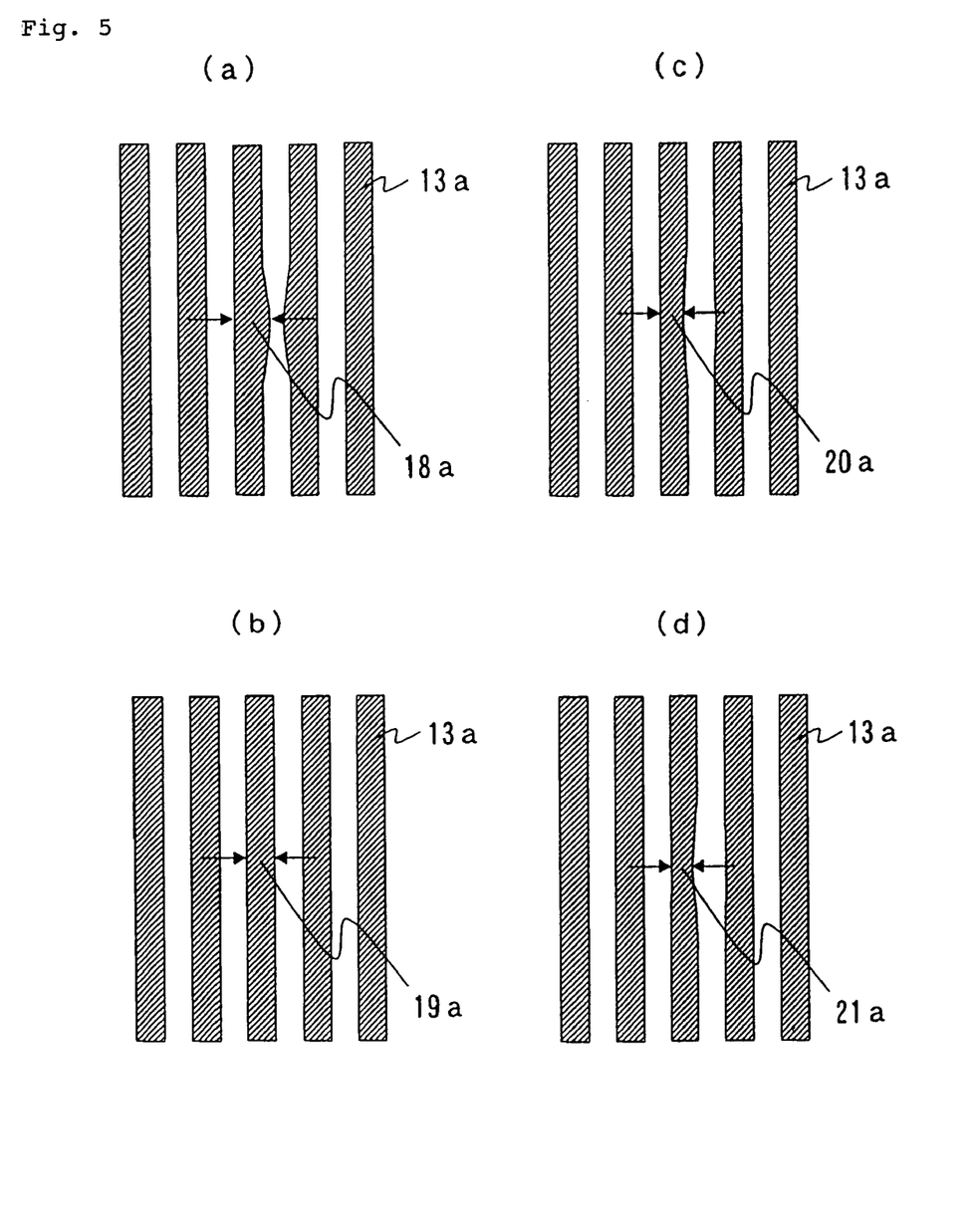
FIG. 5 is a diagram for explaining transferred images corresponding to corrected results in FIG. 4.
Figure 6:
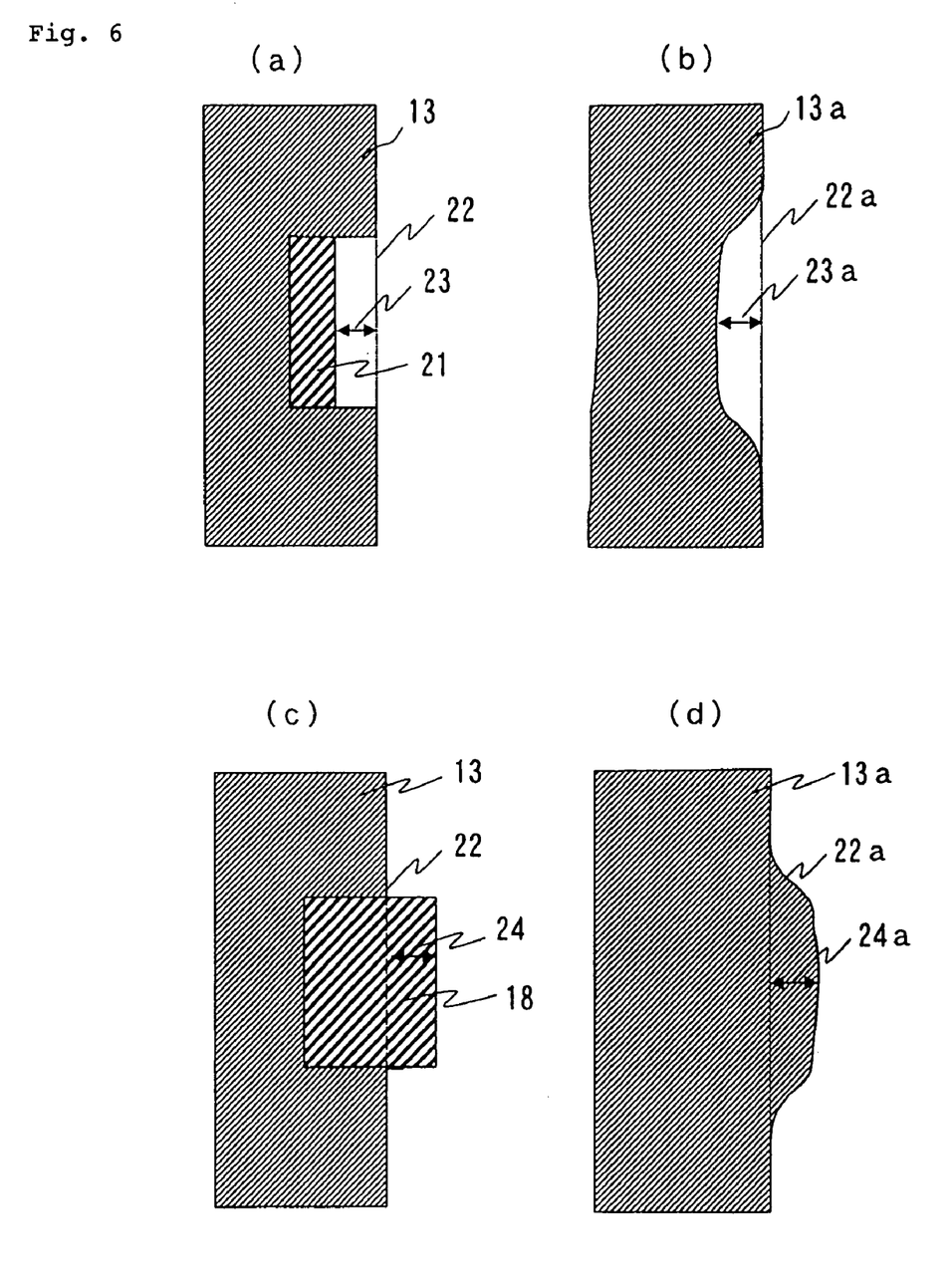
FIG. 6 is a diagram for explaining the problem with a defect correction in a conventional halftone phase shift mask.

FIG. 5 shows the simulated results of the transferred images corresponding to the cases in FIG. 4. Simulation was implemented using a line-and-space pattern at a pitch of 400 nm on a reticle including a defect or a defect corrected portion, under exposure conditions with a wavelength of 193 nm, a numerical aperture (NA) of 0.85, σ out of 0.85, 2/3 annular illuminator and a reduction ratio of 1/4. Here, σ out corresponds to the outer periphery of the aperture on the pupil surface of the projection lens, and σ in corresponding to the inner periphery of the aperture resides at a position two thirds of the σ out from the center of the lens. That is, σ in is 0.57. Further, if required, it is possible to perform simulation with a higher accuracy by including the information on photoresist such as absorbance, refractive index, acid diffusion length and the like.

FIG. 5(a) shows transferred image 18a corresponding to corrected portion 18 in FIG. 4(a). FIG. 5(b) shows transferred image 19a corresponding to corrected portion 19 in FIG. 4(b). FIG. 5(c) shows transferred image 20a corresponding to corrected portion 20 in FIG. 4(c). FIG. 5(d) shows transferred image 21a corresponding to corrected portion 21 in FIG. 4(d). The noticeable point with these results is that if corrected portion 20 in FIG. 4(c), that was corrected in agreement with the geometrical position of the regular portion on the reticle, is transferred, the result pattern on the transferred image will not form a normal pattern but presents a narrower pattern than the normal pattern. What is transferred correctly on the transferred image is a reticle pattern having corrected portion 19 shown in FIG. 4(b), which has to be further corrected on the reticle. This phenomenon is caused by the fact that a direct corrected portion consisting of chromium film having a transmittance of 0% remains in a translucent film having a transmittance of 6 to 8% after the correction of a white defect on a reticle formed of a halftone phase shift mask.

Figure 7:
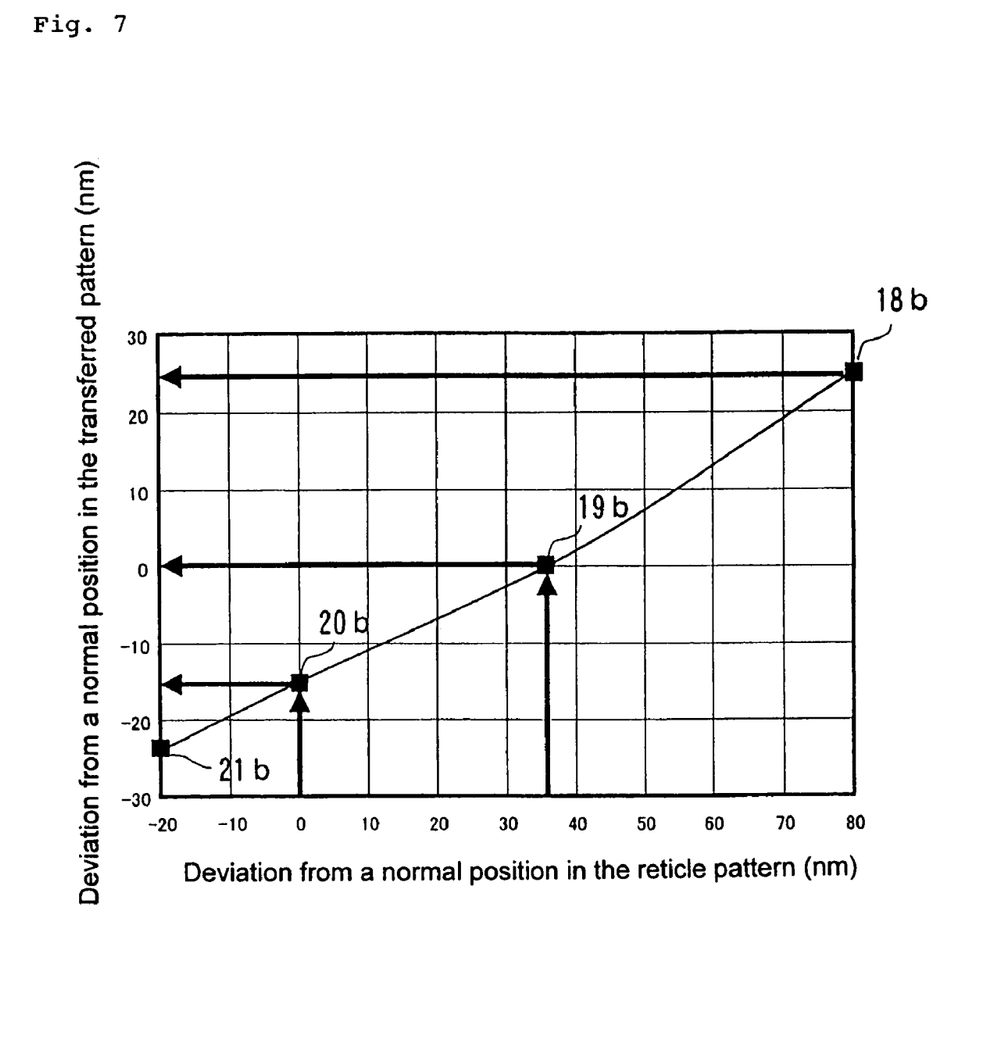
FIG. 7 is a summarized chart from FIGS. 4, 5 and 6, for explaining the problem with a defect correction in a conventional halftone phase shift mask.

FIG. 7 shows a relationship between the positional deviation at the corrected portion on the reticle and that on the transferred image, summarized from the above results shown in FIGS. 4 and 5. The lateral axis represents the amount of deviation from the normal position of a pattern on the reticle and the vertical axis represents the amount of deviation from the normal position in the transferred image. Each axis includes positive and negative deviations. A negative deviation on the lateral axis corresponds to deviation 23 that occurs when the edge of defect corrected portion 21 of reticle pattern 13 shown in FIG. 6(a) resides inside normal portion edge 22. A positive deviation on the lateral axis corresponds to deviation 24 that occurs when the edge of defect corrected portion 18 of reticle pattern 13 shown in FIG. 6(c) resides outside normal portion edge 22. On the other hand, a negative deviation on the vertical axis corresponds to deviation 23a from normal portion edge 22a of transferred pattern 13a shown in FIG. 6(b) and a positive deviation on the vertical axis corresponds to deviation 24a from normal portion edge 22a of transferred pattern 13a shown in FIG. 6(d).

The data point designated at 18b in FIG. 7 corresponds to corrected portion 18 shown in FIG. 4(a), and for a deviation of 80 nm on the reticle, the deviation of corrected portion 18a on the transferred image shown in FIG. 5(a) is 25 nm. Similarly, the data point designated at 19b corresponds to corrected portion 19 shown in FIG. 4(b), and even though a deviation of 35 nm remains on the reticle, the deviation of corrected portion 19a on the transferred image shown in FIG. 5(b) is 0 nm. Also, the data point designated at 20b corresponds to corrected portion 20 shown in FIG. 4(c), and even though the deviation is 0 nm or even though no deviation remains on the reticle, the deviation of corrected portion 20a on the transferred image shown in FIG. 5(c) shows −15 nm. Further, the data point designated at 21b corresponds to corrected portion 21 shown in FIG. 4(d), and for a deviation of −20 nm on the reticle, the deviation of corrected portion 21a on the transferred image shown in FIG. 5(d) is −23 nm.

The above result demonstrates that there is a variance between the corrected state on the reticle and the state on the transferred image.

As described above, when using halftone phase shift masks, which will become essential in the future development of pattern formation into more extra fine configurations, even if an exact physical shape correction is done on a reticle, the transferred image of the reticle pattern, which is projected on a wafer by light rays, cannot be necessarily corrected exactly. Accordingly, it is necessary to reduce the influence of the defect by checking the corrected state of the transferred image with an inspection device every time the defect on the reticle is corrected by a defect correcting apparatus. For this reason, defect correction on a reticle requires a long time, hence this is one cause for the significant reduction in production yield. Further, in an extreme case, an excessive correction makes it impossible to restore the reticle itself, resulting in no alternative but to discard the reticle, causing the problem of a large cost loss.

SUMMARY OF THE INVENTION

In view of the above problems, an exemplary object of the present invention is to avoid the occurrence of corrected reticles being discarded by improving the correction accuracy so as to eliminate overcorrection, and to improve productivity and reduce cost by enhancing correction efficiency and by reducing time required for correction.

In order to achieve the above object, a reticle pattern defect correcting apparatus according to an exemplary aspect of the present invention includes a lithography emulation system and a defect correcting system.

The aforementioned lithographic emulation system includes an optical emulation system and an image processing unit. This optical emulation system includes, at least, an illumination optical lens system for leading irradiation light from a light source to a reticle, a reticle, a projection optical lens system for projecting and focusing the irradiation light having passed through the reticle onto a photo receiver and a light receiving device provided in the photo receiver. Further, the illumination optical lens system and projection optical lens system need to have optical characteristics that are equivalent to the optical characteristics of the illumination optical lens system and to the projection optical lens system which are used when the aforementioned reticle pattern is transferred to a semiconductor wafer surface. Moreover, the aforementioned image processing unit has a function of running a simulation based on light information received by the aforementioned light receiving device and the patterning characteristic information on a photo resist, which has been previously input to the image processing unit, to produce a simulation display of a photoresist pattern to be transferred onto a semiconductor wafer.

Further, the aforementioned defect correcting system includes a micromachining defect correcting mechanism with a cantilever and a control unit. The micromachining defect correcting mechanism includes an AFM (Automatic Force Microscopy) microscope in addition to the defect correcting mechanism, so as to enable monitoring of the pattern defect shape on the reticle. Also, the image processing unit as a part of the lithographic emulation system and the aforementioned control unit as a part of the defect correcting system are connected to each other, so that the image displayed on the image processing unit can also be monitored in the control unit.

Also, a reticle pattern defect correcting method according to an exemplary aspect of the present invention is a method of correcting a reticle pattern defect by using one reticle pattern defect correcting apparatus comprising: a lithographic emulation system including an optical emulation system and an image processing unit; and a defect correcting system including a defect correcting mechanism and a control unit. This method includes steps 1) to 5). Step 1) comprises mounting a reticle on the optical emulation system and locate a reticle pattern defect. Step 2) comprises correcting the reticle pattern defect using the defect correcting system. Step 3) comprises running a simulation based on the light information received by the light receiving device provided for the photo receiver of the optical emulation system and the patterning characteristic information on a photo resist, which has been previously input to the image processing unit, to produce a simulation display of a photoresist pattern to be transferred onto a semiconductor wafer. Step 4) comprises calculating the difference of the correction level in the transferred image of the photoresist pattern, simulation-displayed on the image processing unit, from predetermined permissible specifications. Step 5) is to end the correction of the reticle pattern defect when the calculated difference has been eliminated by iterating the loop from steps 2) to 4).

The defect correction at aforementioned step 2) is carried out while the simulation transferred image of the reticle pattern to be transferred on the semiconductor wafer is being observed. The simulation transferred image is obtained using an apparatus having optical characteristics that are equivalent to that of the light source used in the actual exposure device, the illumination optical lens system and the projection optical lens system, by performing a simulation based on the light information received by the light receiving device provided on the image forming surface and parameters that contribute to the patterning shape of the photo resist.

Further, the defect correcting method is characterized in that the result of the simulation executed by the image processing unit as a part of the lithographic emulation system is transmitted to the control unit as a part of the defect correcting system, so that the reticle pattern defect is corrected using the defect correcting mechanism while the simulation transferred image on the semiconductor wafer, which is displayed on the control unit, is being monitored. It is also possible to correct a reticle pattern correction using the defect correcting mechanism while the transferred image transmitted to the control unit and the defect shape observation image obtained from an AFM microscope provided for the defect correcting mechanism are being monitored for comparison. Further, the defect correcting mechanism can use a micromachining defect correcting mechanism including a cantilever.

The above and other objects, features and advantages of the present invention will become apparent from the following description with reference to the accompanying drawings which illustrate examples of the present invention.

DESCRIPTION OF THE EXEMPLARY EMBODIMENT

To being with, a reticle pattern defect correcting apparatus of the exemplary embodiment will be described referring to FIG. 8.

Figure 8:
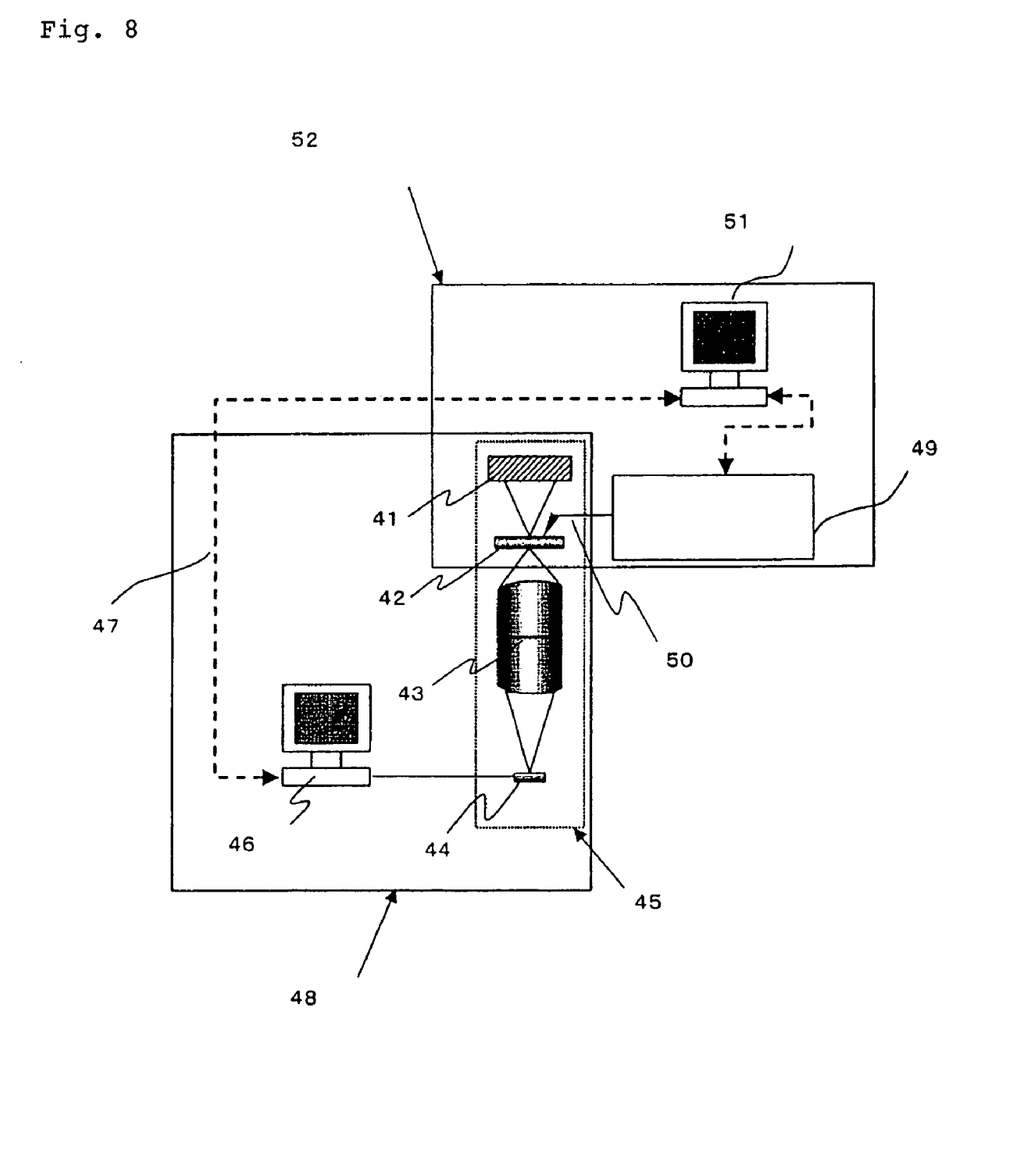
FIG. 8 is an overall schematic diagram showing a reticle pattern defect correcting apparatus according to the present invention.

The reticle pattern defect correcting apparatus of the exemplary embodiment shown in FIG. 8 includes lithographic emulation system 48 and micromachining defect correcting system 52.

The above lithographic emulation system 48 includes optical emulation system 45 and image processing unit 46. Further, optical emulation system 45 includes, at least, illumination optical lens system 41 for leading irradiation light from a light source to a reticle, reticle 42, projection optical lens system 43 for projecting and focusing the irradiation light having passed through the reticle onto a photo receiver and light receiving device 44 provided in the photo receiver. Here, illumination optical lens system 41 and projection optical lens system 43 need to have optical characteristics that are equivalent to the optical characteristics when a reticle pattern is transferred to a semiconductor wafer surface. Further, the aforementioned image processing unit 46 has a function of running a simulation based on the light information received by light receiving device 44 and the patterning characteristic information on a photo resist, which has been previously input to image processing unit 46, to produce a simulation display of the pattern to be transferred onto a semiconductor wafer.

The aforementioned micromachining defect correcting system 52 is comprised of defect correcting mechanism 49 including cantilever 50 and control unit 51. Defect correcting mechanism 49 includes an AFM microscope, and can monitor the shape of a reticle pattern defect. Image processing unit 46, as a part of lithographic emulation system 48, and control unit 51, as a part of micromachining defect correcting system 52, are connected to each other by way of transmission path 47 so that the image information prepared by image processing unit 46 can also be monitored in control unit 51.

Next, a reticle pattern defect correcting method of the exemplary embodiment will be described with reference to FIG. 9.

Figure 9:
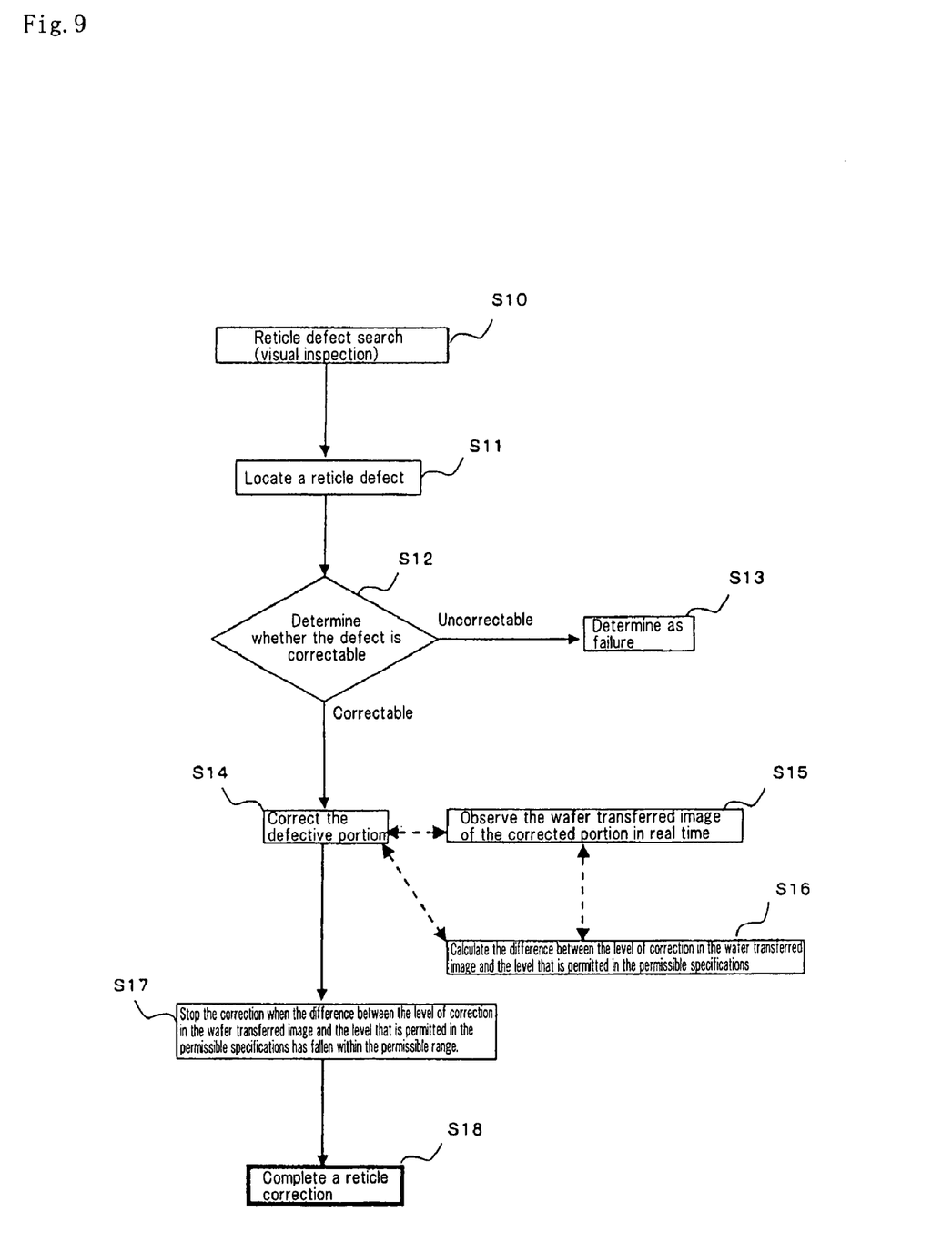
FIG. 9 is a flow chart showing a reticle pattern defect correcting method of the present invention.

FIG. 9 shows a flow chart showing a reticle pattern defect correcting method of the exemplary embodiment. First, a reticle that is finished with pattern formation is set on a visual inspection device so as to check whether there is any defect over the entire surface of the reticle (Step S10). When a pattern defect has been found, the pattern defect is located (Step S11). Then, it is determined whether the pattern defect can be corrected (Step S12). If there exists a large defect that affects a large number of patterns or if there are many defects, the defect or defects are determined to be uncorrectable, and the reticle is determined as a failure and discarded (Step S13). On the other hand, when a defect or defects are determined to be correctable, then the reticle is set on the aforementioned reticle pattern defect correcting apparatus. The transferred image of the defective portion which has been located beforehand is observed by optical emulation system 45 and image processing unit 46 and the obtained information is transmitted to control unit 51. Control unit 51, upon receiving the transmitted information from image processing unit 46, determines the correcting conditions and controls defect correcting mechanism 49 so that cantilever 50 performs a pattern defect correction of reticle 42 (Step S14). When the correcting work of reticle 42 by cantilever 50 starts, the corrected area on the wafer-transferred image is observed through optical emulation system 45 and image processing unit 46 (Step S15).

Image processing unit 46, based on the observed information, calculates the difference between the current correction level and the predetermined permissible specifications in the wafer transferred image (Step S16) and transmits the difference information to control unit 51. Control unit 51 promptly determines whether the correcting work in progress should be continued or ended and controls the operation of defect correcting mechanism 49. In this case, it is also possible to directly transmit the transfer image information acquired by image processing unit 46 to control unit 51 so that control unit 51 will calculate the difference between the correction level and the permissible specifications.

When the correction level of the defect corrected portion has reached the predetermined permissible specifications, control unit 51 ends the operation of defect correcting mechanism 49, and declares that defect correction and confirmation of the corrected result have been completed (Step S17) to finish a series of reticle defect correcting work for the defective portion in question (Step S18).

Figure 10:
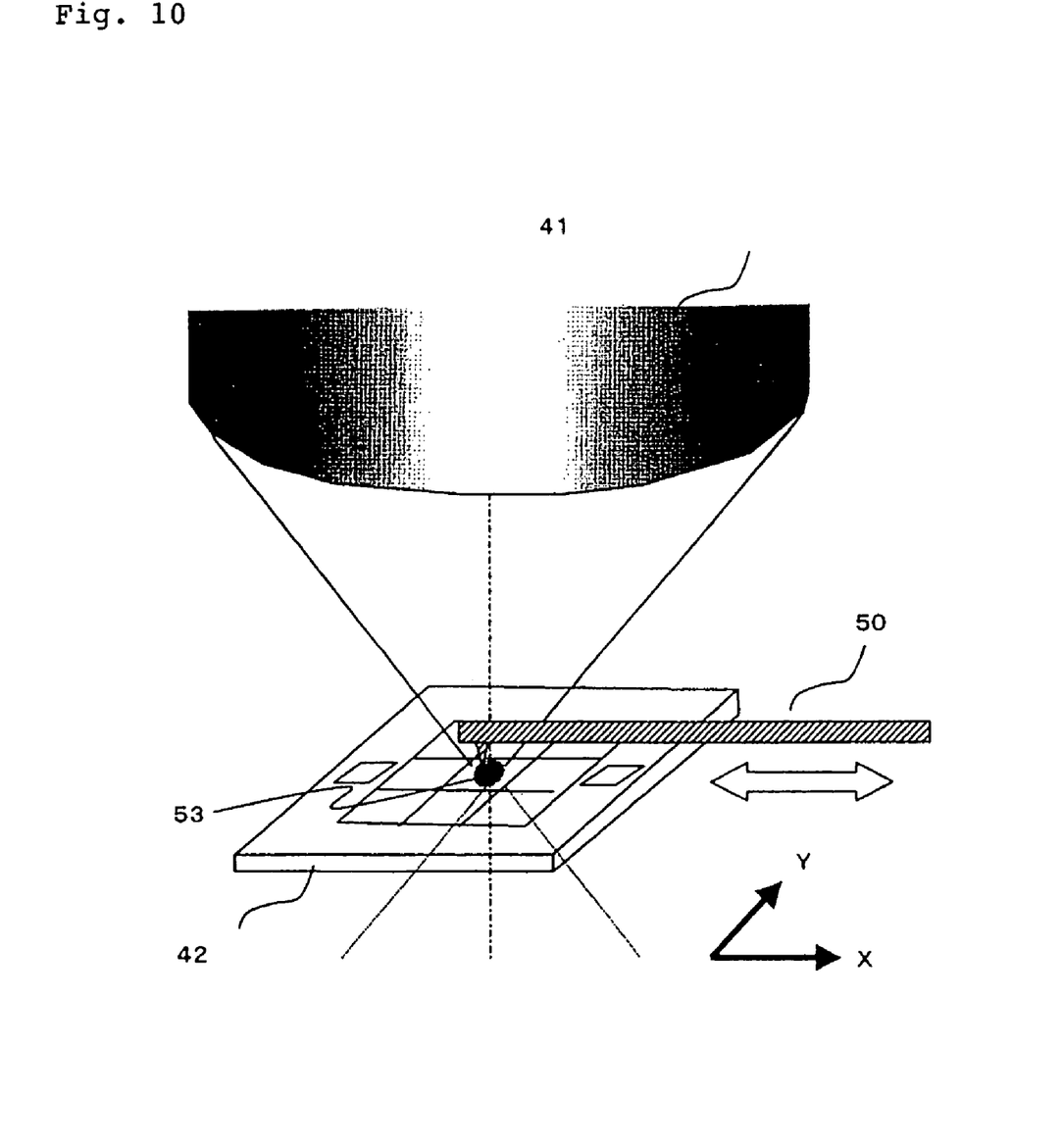
FIG. 10 is a partial schematic diagram for explaining a reticle pattern defect correcting method of the present invention.

FIG. 10 is an enlarged view showing the operation of cantilever 50. When reticle 42 is set or reset to the reticle stage, cantilever 50 is positioned at its standby position. After setting reticle 42, control unit 51 shown in FIG. 8, based on the input defect position information, operates defect correcting mechanism 49 so that cantilever 50 moves to the position of defect 53. After cantilever 50 as a whole moves down into contact with the reticle surface, the cantilever is moved in the X-direction to crush the defective portion. After the first movement in the X-direction has been completed, cantilever 50 is once raised and shifted in the Y-direction, then brought into contact with the reticle surface once again so as to crush the contiguous defective portion by its movement in the X-direction. These sequential operations are performed while the transferred image displayed in control unit 51 is being monitored. When the transferred image has reached the predetermined permissible level, correction of the defective portion is ended. Then cantilever is moved to the position of a defect to be corrected next in order to continue correction. When all defects have been corrected, cantilever 50 is moved to the predetermined standby position, where it is kept in standby mode. Thereafter, the reticle is reset and the defect correction of the reticle pattern is ended.

Though FIG. 10 shows an exemplary case in which single cantilever 50 that moves in the X-direction during correction of a defect is used for correction, in addition to this, another cantilever that can move in the perpendicular (Y-direction) may be provided. Provision of a pair of cantilevers that move in two perpendicular directions enables easy correction in accordance with the shape of a defect. Further, in order to facilitate correction of a pattern that is laid out obliquely to each side of the reticle, a rotary mechanism may be provided for the reticle stage. Moreover, in order to prevent the crushed pieces that originated from the physical crush from scattering over the other patterns to produce additional defects, a vacuum exhaust pipe may be preferably arranged with the cantilever configuration so as to suck and exhaust the neighborhood of the cantilever needle.

Figure 11:
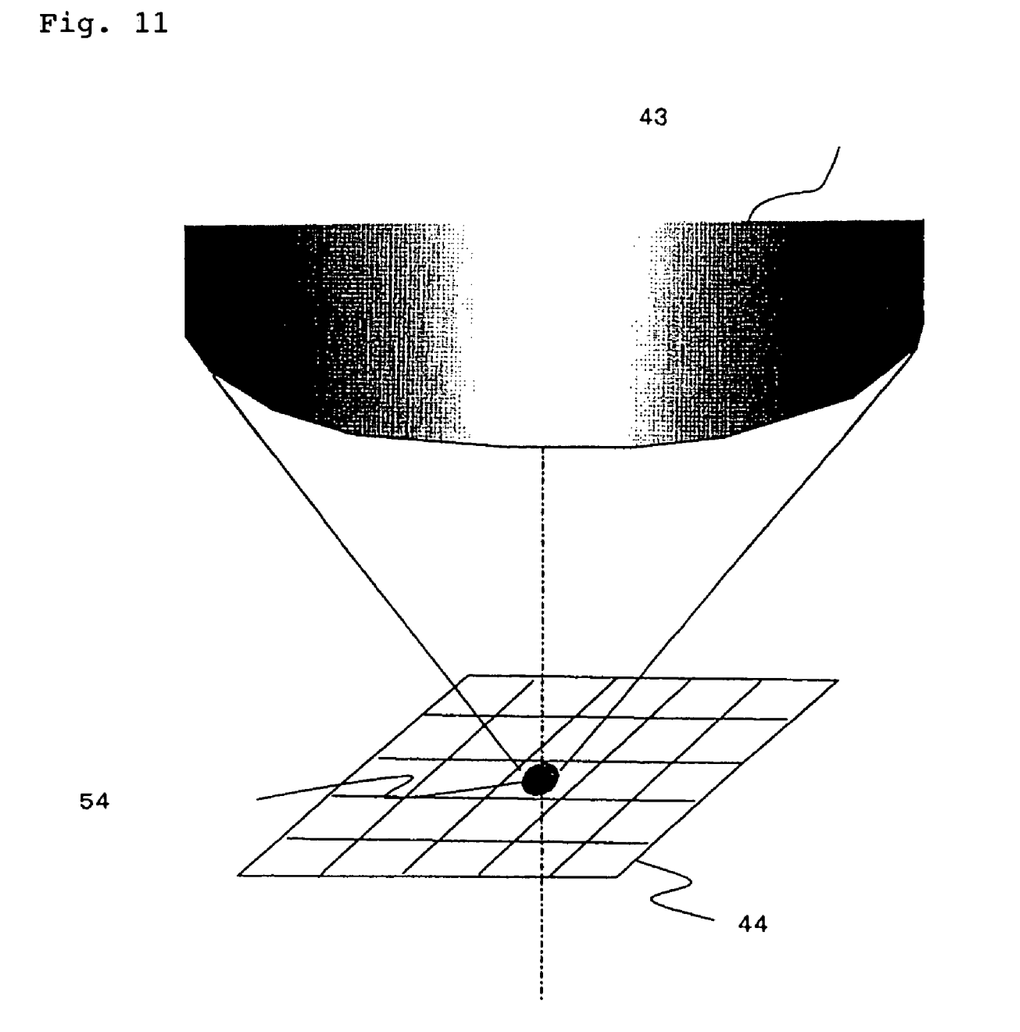
FIG. 11 is a partial schematic diagram for explaining a reticle pattern defect correcting method of the present invention; and, FIG. 12 is a schematic diagram for illustrating an example of correcting a pattern in accordance with a reticle pattern defect correcting method of the present invention.

FIG. 11 is an enlarged view of an image receiver. The irradiation light that has passed through the reticle pattern corrected in FIG. 10 is focused onto the image-forming surface where light receiving device 44 is arranged, as transfer optical image 54 that corresponds to defect 53 as it is reduced by projection optical lens system 43. Transfer optical image 54 received by light receiving device 44 is transformed into a transfer pattern image by simulation in image processing unit 46 shown in FIG. 8. The light receiving device may employ a photoelectric transducer such as a CCD (Charge Coupled Device) image sensor, etc.

Figure 12:
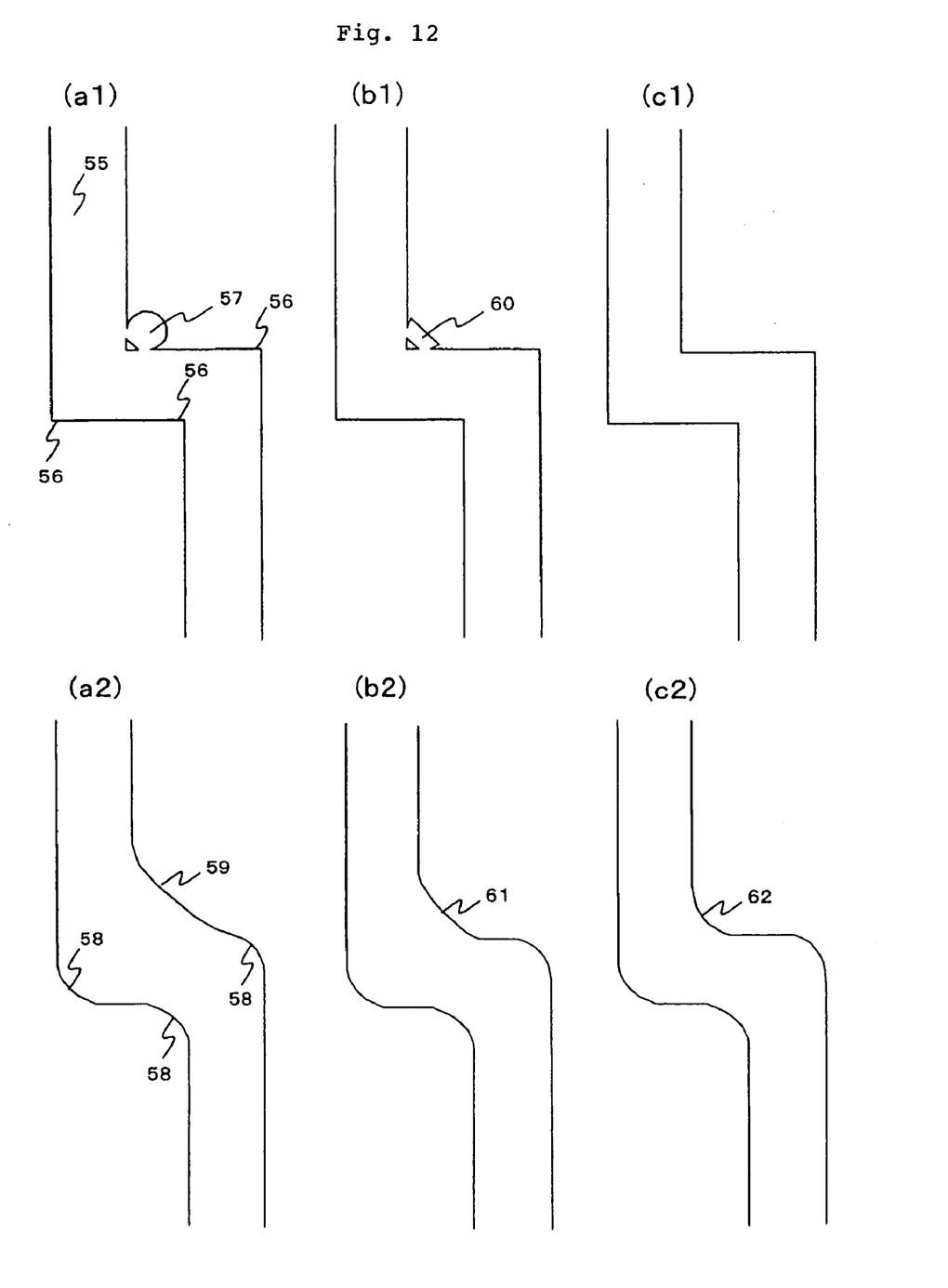

FIG. 12 shows a correction example in which a projection defect resides at an inside corner of a cranked line pattern on a reticle. FIG. 12(*a*1) shows a state in which projection defect 57 exists at an upper inside corner of cranked line pattern 55, formed on a reticle, having multiple corner portions 56.

The shape of the defect on the reticle is observed by an AFM microscope that is incorporated in the defect correcting apparatus. FIG. 12(*a*2) shows a transferred image corresponding to the above defect. Though corner portions 56 on the reticle are slightly rounded by the influence of an optical proximity effect, they are transferred as corner portions 58 where the curvature radius becomes the smallest supreme condition under predetermined lithography conditions. On the other hand, the transferred image corresponding to projection defect 57 is reproduced as corner portion 59 having a markedly greater radius of curvature than that of corner portion 58. There is a fear that if there is another similarly shaped pattern nearby, this transfer condition may make the two patterns indivisible. FIG. 12(*b*1) shows a state in which defect 57 has been corrected and reduced roughly by half in size to defect 60 by actuating cantilever 50, i.e., defect correcting mechanism 49 acting in accordance with the control signal from control unit 51 shown in FIG. 8. FIG. 12(*b*2) shows a transferred image corresponding to defect 60. Corner portion 61 corresponding to defect 60, on the transferred image, has a greater radius of curvature compared to that of the other corner portions 58 of the best condition, so that it is determined that the correction level is not sufficient to reach the permissible specifications and correction is continued. Finally, this loop of correction is repeated until the reticle pattern shown in FIG. 12(*c*1) is fulfilled so that corner portion 62 that corresponds to the defect on the transferred image becomes equivalent to the other corner portions 58 as shown in FIG. 12(*c*2) and falls within the predetermined range of specifications.

Here, a correction example of a reticle that is not a halftone phase shift mask was shown in FIG. 12. Also, when a white defect on a reticle of a halftone phase shift mask is corrected by filling chromium having a different light transmittance and then removing the excessively projected part, the transferred image after correction can be corrected by observing the corrected result in real time, and it is therefore possible to achieve efficient correction without overcorrection.

As has been described heretofore, according to the present invention, since the reticle pattern defect correcting apparatus itself includes a transfer image observing function, it is possible to perform correction of a defect while the transferred image that is to be transferred to the wafer is being checked. As a result it is possible to avoid the occurrence of corrected reticles being discarded by improving the correction accuracy so as to eliminate overcorrection as well as to improve productivity and reduce cost by enhancing the correction efficiency and by reducing the time required for correction.

While exemplary embodiments of the present invention have been described using specific terms, such description is for illustrative purposes only, and it is to be understood that changes and variations may be made without departing from the spirit or scope of the following claims.

What is claimed is:

1. A reticle pattern defect correcting apparatus, comprising:
   a lithographic emulation system for generating a transferred image for a reticle pattern, the lithographic emulation system including an optical emulation system and an image processing unit; and
   a defect correcting system for correcting a defect in the reticle pattern based on the transferred image, the defect correcting system including a defect correcting unit and a control unit for controlling the defect correcting unit, wherein the image processing unit, based on observed information of a corrected area on a wafer transferred image through the optical emulation system, calculates a difference between a current correction level and predetermined permissible specifications for the wafer transferred image and transmits information on the difference to the control unit, and wherein the defect correcting system repeats the correcting of the reticle pattern defect and the image processing unit repeats the calculating of the difference until the calculated difference is within a permissible range.

2. The reticle pattern defect correcting apparatus according to claim 1, wherein said image processing unit has a function of running a simulation based on light information received by said light receiving device and patterning characteristic information on a photo resist, which has been previously input to said image processing unit, to produce a simulation display of a photoresist pattern to be transferred onto a semiconductor wafer.

3. The reticle pattern defect correcting apparatus according to claim 1, wherein the control unit calculates a difference between a level of correction in the transferred image and a permissible specification, and if the difference is not within a permissible range, then the control unit controls the defect correcting unit to continue an operation of correcting the defect, and if the difference is within a permissible range, then the control unit moves the defect correcting unit to a position of another defect in the reticle pattern.

4. The reticle pattern defect correcting apparatus according to claim 1, wherein the defect correcting unit further includes a microscope for monitoring a shape of the defect in the reticle pattern and generating a defect shape observation image, and wherein the control unit compares the transferred image and the defect shape observation image and controls the defect correcting unit to correct the defect based on the comparison.

5. The reticle pattern defect correcting apparatus according to claim 1, wherein the optical emulation system comprises a projection optical lens system which focuses irradiation light that has passed through the reticle pattern onto an image-forming surface as a transfer optical image, and the image processing unit transforms the transfer optical image into the transferred image by simulation.

6. The reticle pattern defect correcting apparatus according to claim 1, wherein the transferred image comprises a simulated image of a pattern to be transferred onto a semiconductor wafer by the reticle pattern.

7. The reticle pattern defect correcting apparatus according to claim 1, wherein the defect correcting system corrects the defect in the reticle pattern while the lithographic emulation system observes the transferred image for the reticle pattern.

8. The reticle pattern defect correcting apparatus according to claim 1, wherein said defect correcting unit comprises a micromachining defect correcting mechanism including a cantilever.

9. The reticle pattern defect correcting apparatus according to claim 1, wherein said optical emulation system includes an illumination optical lens system for leading irradiation light from a light source to a reticle, a projection optical lens system for projecting and focusing the irradiation light having passed through said reticle onto a photo receiver and a light receiving device provided in said photo receiver.

10. The reticle pattern defect correcting apparatus according to claim 9, wherein said illumination optical lens system and said projection optical lens system have optical characteristics equivalent to optical characteristics of an illumination optical lens system and projection optical lens system for transferring said reticle pattern to a semiconductor wafer surface.

11. The reticle pattern defect correcting apparatus according to claim 1, wherein the control unit, as a part of said defect correcting system, and said image processing unit, as a part of said lithographic emulation system, are connected to each other.

12. The reticle pattern defect correcting apparatus according to claim 11, wherein said control unit can monitor the image displayed on said image processing unit.

13. A reticle pattern defect correcting method for correcting a reticle pattern defect, the method comprising:

in a reticle pattern defect correcting apparatus comprising a lithographic emulation system including an optical emulation system and an image processing unit; and a defect correcting system including a defect correcting unit and a control unit:

mounting a reticle on said optical emulation system and locating a reticle pattern defect;

correcting said reticle pattern defect using said defect correcting system;

running a simulation based on light information received by a light receiving device provided for a photo receiver of said optical emulation system and patterning characteristic information on a photo resist which has been previously input to said image processing unit, to produce a simulation transferred image comprising a simulation display of a photoresist pattern to be transferred onto a semiconductor wafer;

calculating a difference between a correction level in the transferred image of the photoresist pattern, simulation-displayed on said image processing unit, and predetermined permissible specifications; and repeating the correcting of the reticle pattern defect, the running of the simulation and the calculating of the difference until said calculated difference has been eliminated.

14. The reticle pattern defect correcting method according to claim 13, wherein said defect correcting unit comprises a micromachining defect correcting unit including a cantilever.

15. The reticle pattern defect correcting method according to claim 13, wherein the correction of the reticle pattern defect at said correcting said reticle pattern defect is carried out while the simulation transferred image of the reticle pattern to be transferred on the semiconductor wafer is being observed.

16. The reticle pattern defect correcting method according to claim 15, wherein said simulation transferred image is obtained using an apparatus having optical characteristics equivalent to optical characteristics of a light source used in an actual exposure device, an illumination optical lens system and a projection optical lens system, by performing a simulation based on the light information received by the light receiving device provided on an image forming surface and parameters that contribute to a patterning shape of the photo resist.

17. The reticle pattern defect correcting method according to claim 16, wherein a result of said simulation executed by the image processing unit as a part of said lithographic emulation system is transmitted to the control unit as a part of said defect correcting system, so that the reticle pattern defect is corrected using said defect correcting unit while the simulation transferred image on the semiconductor wafer, which is displayed on said control unit, is being monitored.

18. A reticle pattern defect correcting apparatus, comprising:
- an optical emulation system which focuses irradiation light that has passed through a reticle pattern to form a transfer optical image on a surface;
- an image processing unit which transforms the transfer optical image into a transferred image by simulation and calculates a difference between a current correction level and predetermined permissible specifications for the transferred image; and
- a defect correcting unit which corrects a defect in the reticle pattern; and
- a control unit which controls the defect correcting unit to correct the defect based on the transferred image while the optical emulation system observes the transferred image,
- wherein the defect correcting unit repeats the correcting of the reticle pattern defect and the image processing unit repeats the calculating of the difference until the calculated difference is within a permissible range.

19. A method of manufacturing a semiconductor device by using a reticle having a pattern defect repaired by a reticle pattern defect correcting method, the reticle pattern defect correcting method comprising:
- in a reticle pattern defect correcting apparatus comprising a lithographic emulation system including an optical emulation system and an image processing unit, and a defect correcting system and a control unit:
  - mounting a reticle on said optical emulation system and locating a reticle pattern defect;
  - correcting said reticle pattern defect using said defect correcting system;
- running a simulation based on light information received by a light receiving device provided for a photo receiver of said optical emulation system and patterning characteristic information on a photo resist, which has been previously input to said image processing unit, to produce a simulation transferred image comprising a simulation display of a photoresist pattern to be transferred onto a semiconductor wafer;
- calculating a difference between a correction level in the transferred image of the photoresist pattern, simulation-displayed on said image processing unit, and predetermined permissible specifications; and
- repeating the correcting of the reticle pattern defect, the running of the simulation and the calculating of the difference until said calculated difference has been eliminated.

* * * * *